(12) United States Patent
von Malm (10) Patent No.: US 10,925,132 B2
(45) Date of Patent: Feb. 16, 2021

(54) MULTIPIXEL LED COMPONENT AND METHOD OF OPERATING A MULTIPIXEL LED COMPONENT

(71) Applicant: OSRAM Opto Semiconductors GmbH, Regensburg (DE)

(72) Inventor: Norwin von Malm, Nittendorf (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/347,269

(22) PCT Filed: Nov. 17, 2017

(86) PCT No.: PCT/EP2017/079600
§ 371 (c)(1),
(2) Date: May 3, 2019

(87) PCT Pub. No.: WO2018/091657
PCT Pub. Date: May 24, 2018

(65) Prior Publication Data
US 2019/0281679 A1  Sep. 12, 2019

(30) Foreign Application Priority Data
Nov. 18, 2016 (DE) ..................... 10 2016 122 237.2

(51) Int. Cl.
*H05B 45/20* (2020.01)
*H01L 23/66* (2006.01)
(Continued)

(52) U.S. Cl.
CPC ............ *H05B 45/20* (2020.01); *H01L 23/66* (2013.01); *H01L 25/0753* (2013.01);
(Continued)

(58) Field of Classification Search
CPC ............ H05B 33/0857; H05B 33/0863; H05B 45/20; H05B 47/19; H01L 25/0753;
(Continued)

(56) References Cited

U.S. PATENT DOCUMENTS 7,521,872 B2  4/2009 Bruning
9,450,505 B2  9/2016 Siessegger et al.
(Continued)

FOREIGN PATENT DOCUMENTS

CN         101321421 A    12/2008
DE   10 2011 056 888 A1    6/2013
(Continued)

*Primary Examiner* — Raymond R Chai
(74) *Attorney, Agent, or Firm* — DLA Piper LLP (US)

(57) ABSTRACT

A multipixel LED component includes a plurality of emission zones; a plurality of conversion elements adapted to convert radiation emitted from the emission zones into radiation of another wavelength range; a controller including a plurality of current sources and a transmitter adapted for wireless data transmission; and two electrical contact structures through which the LED component is energized, wherein the controller mechanically fixedly connects to the emission zones, each of the current sources is assigned to one of the emission zones biuniquely, the transmitter receives signals to control the current sources, the current sources are controllable according to the signals, each current source operates the emission zone assigned to it, and the number of emission zones is greater than the number of contact structures.

9 Claims, 4 Drawing Sheets

(51) Int. Cl.

| | |
|---|---|
| *H01L 25/16* | (2006.01) |
| *H01L 33/48* | (2010.01) |
| *H01L 33/50* | (2010.01) |
| *H01L 33/62* | (2010.01) |
| *H01L 27/15* | (2006.01) |
| *H01L 25/075* | (2006.01) |
| *H05B 47/19* | (2020.01) |

(52) U.S. Cl.
 CPC .......... *H01L 25/167* (2013.01); *H01L 27/156* (2013.01); *H01L 33/486* (2013.01); *H01L 33/505* (2013.01); *H01L 33/62* (2013.01); *H05B 47/19* (2020.01); *H01L 33/50* (2013.01); *H01L 2223/6677* (2013.01)

(58) Field of Classification Search
 CPC ..... H01L 25/167; H01L 27/156; H01L 33/62; H01L 33/505; H01L 33/486; H01L 33/50; H01L 23/66; H01L 2223/6667
 See application file for complete search history.

(56) References Cited

U.S. PATENT DOCUMENTS

| | | | |
|---|---|---|---|
| 2009/0251352 A1* | 10/2009 | Altonen | G08C 17/02 |
| | | | 341/176 |
| 2011/0199275 A1 | 8/2011 | Hoofman | |
| 2013/0002157 A1* | 1/2013 | van de ven | H05B 45/60 |
| | | | 315/192 |
| 2013/0154519 A1 | 6/2013 | Riesebosch | |
| 2013/0320369 A1 | 12/2013 | Gärtner et al. | |
| 2015/0014716 A1 | 1/2015 | von Malm | |
| 2016/0141332 A1* | 5/2016 | Vaufrey | H01L 33/005 |
| | | | 257/88 |
| 2017/0133356 A1 | 5/2017 | Mercier et al. | |
| 2017/0309794 A1 | 10/2017 | von Malm | |
| 2019/0067529 A1* | 2/2019 | Doan | H01L 33/50 |

FOREIGN PATENT DOCUMENTS

| | | |
|---|---|---|
| DE | 11 2013 000 619 T5 | 11/2014 |
| DE | 10 2014 112 551 A1 | 3/2016 |
| FR | 3 023 066 A1 | 1/2016 |

\* cited by examiner

MULTIPIXEL LED COMPONENT AND METHOD OF OPERATING A MULTIPIXEL LED COMPONENT

TECHNICAL FIELD

This disclosure relates to a multipixel LED component and a method of operating a multipixel LED component.

BACKGROUND

There is a need to provide a multipixel LED component that is particularly efficient and compact and a method of operating such a multipixel LED component.

SUMMARY

I provide a multipixel LED component including a plurality of emission zones; a plurality of conversion elements adapted to convert radiation emitted from the emission zones into radiation of another wavelength range; a controller including a plurality of current sources and a transmitter adapted for wireless data transmission; and two electrical contact structures through which the LED component is energized, wherein the controller mechanically fixedly connects to the emission zones, each of the current sources is assigned to one of the emission zones biuniquely, the transmitter receives signals to control the current sources, the current sources are controllable according to the signals, each current source operates the emission zone assigned to it, and the number of emission zones is greater than the number of contact structures.

I also provide a method of operating a multipixel LED component including a multiplicity of emission zones, a controller having a multiplicity of current sources and a transmitter adapted for wireless data transmission, and two electrical contact structures, in which signals that control the emission zones are received by the transmitter, the current sources are driven as a function of the signals received via the transmitter, the current sources operate the emission zones separately from one another, and the multipixel LED component is powered exclusively via the two electrical contact structures.

I further provide a multipixel LED component including a plurality of emission zones; a plurality of conversion elements adapted to convert radiation emitted from the emission zones into radiation of another wavelength range; a controller including a plurality of current sources and a transmitter adapted for wireless data transmission; and two electrical contact structures through which the LED component is energized, wherein the control unit is mechanically fixedly connected to the emission zones, each of the current sources is assigned to one of the emission zones biuniquely, the transmitter receives signals that control the current sources, the current sources are controllable according to the signals, each current source operates the emission zone assigned to it, the number of emission zones is greater than the number of contact structures, and the contact structures are arranged directly on an outer surface of the control unit.

REFERENCE SIGNS

1 Multipixel LED component
10 LED chip
20 control unit
20a outer surface of the control unit
30 contact structure
31 contact pad
41 first conversion element
42 second conversion element
50 optical component
60 contact medium layer
70 housing
72 Transparent area of the housing
75 connecting wire
100 emission zone
100a Emission surface of an emission zone
101 layer
110 n-contact
111 insulator
112 p-contact
113 p-conductive region
114 active region
115 n-conductive region
200 current source
200a first electrical contact
200b second electrical contact
202 antenna structure
201 transmission unit
1000 Group of emission zones
A Distance between adjacent emission zones
S signal

DETAILED DESCRIPTION

My multipixel LED component is a radiation-emitting optoelectronic component. The component can emit light in the visible wavelength range during operation. The visible wavelength range extends between the wavelength ranges of UV radiation and infrared radiation.

The LED component may comprise a plurality of emission zones. The emission zones are formed with a semiconductor material, in particular a compound semiconductor material, for example, a III-V compound semiconductor material. The emission zones are, for example, produced by an epitaxial process in a common process on a common substrate. In particular, the emission zones then have the same material composition and generate electromagnetic radiation of the same wavelength range during normal operation.

The emission zones include, for example, several semiconductor layers of which one semiconductor layer forms an active region in which electromagnetic radiation is generated during normal operation. For example, the active regions of adjacent emission zones are not in direct contact with each other, but are arranged at a distance from each other. Emission zones adjacent to each other are emission zones between which no further emission zone is located. In particular, the emission zones may have a layer through which the emission zones are in direct mechanical contact with each other.

The multipixel LED component comprises a plurality of pixels. For example, a single pixel of the multipixel LED component has exactly one emission zone. Alternatively, a single pixel of the multipixel LED component comprises a group of emission zones. The emission zones of the pixels can then form subpixels of the pixel. The emission zone is the region through which a large part of the electromagnetic radiation generated is emitted during normal operation of the emission zone.

The LED component may comprise a plurality of conversion elements adapted to convert radiation emitted from the emission zones into radiation of a different wavelength range. For example, each of the conversion elements is assigned to an emission zone. In particular, each conversion element is biuniquely assigned to an emission zone. The conversion elements are each arranged on an emission surface of the emission zone assigned to the conversion element.

The LED component may comprise a control unit having a plurality of current sources and a transmission unit adapted for wireless data transmission. The control unit is, for example, a microcontroller with a plurality of current sources and at least one transmission unit. In particular, the current sources and the transmission unit are part of the control unit. The control unit can, for example, be formed with a silicon chip in which the transmission unit and the current sources are monolithically integrated.

Furthermore, the control unit may include, for example, an antenna device by which wireless signals, in particular radio signals, are transmitted and/or received. In particular, the antenna device may be monolithically integrated into the control unit. During intended operation, signals are received by the antenna device.

The transmission unit converts the received signals into control signals by which the current sources are controlled separately. The current sources energize the emission zones depending on the control signal.

The LED component may have two electrical contact structures through which the LED component is energized. For example, the LED component has exactly two electrical contact structures through which the LED component is energized. In particular, the LED component has no other electrical contact structures via which the LED component can be electrically contacted from the outside.

The control unit may be mechanically fixed to the emission zones. For example, the control unit and the emission zones are in direct mechanical contact with each other or firmly connect via a contact medium layer. The control unit and the emission zones can firmly mechanically connect to each other via a material-locking connection, e.g., by a contact medium layer. For example, the contact medium layer is a structured solder layer. Alternatively, the control unit may be in direct mechanical contact with the emission zones. The emission zones and the control unit are not arranged as separate modules on a common connection board, but rather form a single unit.

One of the current sources may be biuniquely assigned to each emission zone. Each emission zone electrically conductively connects to the current source assigned to the emission zone. For example, each emission zone electrically conductively connects to a current source by a structured contact medium layer. Each emission zone is powered and operated by the current source assigned to it.

The transmission unit may receive signals that control the current sources. In particular, the transmission unit comprises an antenna structure by which radio signals can be transmitted and received. In particular, the signals are Bluetooth signals, ZigBee signals, Z-Wave signals or WLAN signals. The signals comprise data converted into control signals by the transmission unit.

The current sources can be controlled according to the signals. For example, the transmission unit converts the received signals into control signals with which the current sources are controlled. In particular, the control signals are used to specify a current which flows through the output of each current source.

Each current source may operate its assigned emission zone. For example, each current source electrically conductively connects to its assigned emission zone and is sufficiently powerful to operate the emission zone according to a control signal. A sufficiently powerful current source supplies a sufficiently large current flow at its output so that electromagnetic radiation is generated in the emission zones as intended.

The number of emission zones may be greater than the number of contact structures. For example, the LED component comprises exactly two contact structures via which the LED component is electrically contacted and energized. The LED component thus comprises at least three emission zones. In particular, the LED component does not include an electrical contact structure by which information concerning the control of the LED component is transmitted. For example, current flows through the contact structures exclusively to provide the electrical power to operate the LED component.

My multipixel LED component comprises: a plurality of emission zones; a plurality of conversion elements adapted to convert radiation emitted from the emission zones into radiation of another wavelength range; a control unit comprising a plurality of current sources; and a transmission unit adapted for wireless data transmission; and two electrical contact structures via which the LED component is supplied with current, the control unit mechanically fixedly connected to the emission zones, one of the current sources biuniquely assigned to each emission zone, the transmission unit receiving signals that control the current sources, the current sources being controllable in accordance with the signals, each current source operating the emission zone assigned to it, and the number of emission zones being greater than the number of contact structures.

A multipixel LED component is based, among other things, on the following consideration. To provide light sources in which the color location of the emitted light can be adjusted, LEDs emitting different colors can be used. The light of the LEDs emitting different colors is mixed by a mixing element arranged downstream of the LEDs. The mixture means that the emitted light cannot be allocated to the individual LEDs, but is perceived as light from a single light source. In such an example of a color controlled light source, the adjustable color location of the emitted light is limited by the number of LEDs and the number of contact structures for electrical contacting of the LEDs. Furthermore, the mixing element limits the minimum size of the color controllable light source.

The multipixel LED component makes use, among other things, of the idea of providing a compact, easy-to-contact, color-controllable light source. The color-controlled light source comprises a plurality of jointly produced emission zones that can be controlled separately from each other. Conversion elements are arranged downstream of the emission zones to adapt the color of the emitted light. The color controllable light source also includes a control unit for separate control and operation of the emission zones. The emission zones are particularly close to each other.

It is advantageous that the distance between individual emission zones is small so that the emitted radiation from neighboring emission zones mixes, and an observer, for example, at a distance of more than 10 cm, perceives the emitted radiation from the emission zones as the light of a single light source that emits mixed light. Thus, when a plurality of emission zones are used, no mixing element is necessary to give the observer the impression that the emission zones are a single light source. This advantageously enables a particularly space-saving and compact design of the color-controlled light source.

Furthermore, the control unit and the emission zones mechanically firmly connect to each other and can be in direct contact with each other. For example, the control unit is a microcontroller in which the transmission unit and the current sources are monolithically integrated. The control unit and the emission zones electrically connect via a structured solder connection and form a single module. Furthermore, the control unit comprises a transmission unit with an antenna structure, designed for wireless data transmission, and exactly two contact structures that power the multipixel LED component. Advantageously, the integrated transmission unit enables wireless data transmission so that the multipixel LED component can receive signals that specify how the individual emission zones are to be powered by the control unit's current sources. Wireless data transmission enables the multipixel LED component to require just two contacts for electrical contacting, making it particularly easy to connect.

By the transmission unit designed for wireless data transmission, the component can be controlled as easily as possible. This makes it possible to adjust the color of the light emitted by the component using an app operated on a mobile phone, for example.

The emission zones may be part of a common LED chip. The LED chip, for example, is formed with a semiconductor material, in particular a compound semiconductor material, for example, a III-V compound semiconductor material. The emission zones of the LED chip are produced, for example, by an epitaxial process in a common process on a common substrate. The emission zones of the LED chip then have the same material composition in particular and generate electromagnetic radiation of the same wavelength range during normal operation.

Each emission zone may be formed by an LED chip. For example, the emission zones are manufactured separately from each other. In particular, the control unit may operate the emission zones independently of each other. For example, the LED chips are arranged on the control unit by a printing process. In particular, the emission zones are transferred to the control unit by a stamp. Furthermore, the multipixel LED component can be transferred to a carrier by a printing process.

For example, several control units are manufactured in a common compound. The emission zones can be applied in the form of individual LED chips by a printing process to the compound of control units. For example, the emission zones connected to the control units form the multipixel LED components. The multipixel LED components can, for example, be at least partially removed from the compound by etching. In particular, the multipixel LED component may exhibit traces of an etching process. After etching, for example, the multipixel LED components are mechanically coupled to the compound exclusively via beam structures. The multipixel LED components can be detached from the compound during transfer by a stamp, destroying the beam structures. For example, the finished multipixel LED components have parts or remnants of beam structures. The parts or remnants of the beam structures can extend along the main extension plane of the multi-pixel LED component and protrude laterally from the side surfaces of the multi-pixel LED component. In particular, the parts of the beam structures are formed with the material of the control unit.

The emission zones and the control unit may be arranged at least partially overlapping each other in a vertical direction. The vertical direction is a direction perpendicular to the main extension plane of the LED chip. In particular, the emission zones and the control unit are arranged completely overlapping. In lateral directions that run parallel to the main extension plane of the LED chip, the control unit is then flush with the LED chip. Advantageously, such an arrangement of the control unit at the emission zones enables a particularly compact design of the multipixel LED component.

The distance in the lateral direction between two adjacent emission zones may be a maximum of 100 μm. The lateral direction is a direction parallel to the main extension plane of the semiconductor chip. In particular, the distance between two adjacent emission zones is a maximum of 5 μm, preferably a maximum of 2 μm. It is advantageous that two emission zones in the far field, i.e., from a distance of more than 10 cm between the observer and the emission zones, are perceived as a single light source. In particular, only the mixed light of the sum of the operated emission zones is perceived in the far field. For example, no optical mixing element such as a diffuser is arranged downstream of the emission zones in their beam path to obtain mixed light. Due to the small distance between the individual emission zones, the light emitted simultaneously by the emission zones is perceived as mixed light without an optical mixing element being arranged downstream in the beam path of the emission zones. This enables a particularly space-saving design of a color-controlled light source. Furthermore, there is no absorption of light by the mixing element that enables particularly efficient operation.

The control unit may be formed with silicon. For example, the control unit is a silicon chip manufactured using typical CMOS technology processes. In particular, the control unit is formed with the silicon chip of a microcontroller. For example, the current sources and the transmission unit of the control unit are monolithically integrated in a common chip. In particular, the antenna device of the transmission unit is monolithically integrated into the chip. Advantageously, the control unit is particularly compact and serves, for example, as the mechanically supporting structure of the multipixel LED component.

The emission zones may emit light in the blue wavelength range and the conversion elements may comprise first and second conversion elements. The first conversion elements may convert the emitted light of some emission zones into light in the green wavelength range and the second conversion elements may convert the emitted light of some emission zones into light in the red wavelength range. The multipixel LED component thus comprises emission zones produced in a common process and in whose active region light of a common wavelength range is generated, the wavelengths of the generated light of different emission zones deviating from each other by a maximum of 1%, in particular by a maximum of 0.1%.

The first and second conversion elements convert at least part of the generated electromagnetic radiation into light in the green and/or red wavelength range. Advantageously, such a component can provide a color controllable light source that can emit light over a wide range of the RGB color space. For example, the color location and the intensity of the mixed light emitted by the multipixel LED component can be adjusted by selectively controlling the emission zones.

At least one optical component in the beam path may be arranged downstream of some emission zones. The at least one optical component may change the radiation profile of the radiation emitted by the emission zones to which the optical component is arranged downstream. For example, the optical component can be an optical lens, especially a Fresnel lens that focuses or scatters the emitted light. Alternatively, the optical element can refract the emitted electromagnetic radiation such that the electromagnetic radiation is not emitted perpendicular to the main extension plane of the emission zones. In particular, the optical component can only be subordinate to some of the emission zones in the beam path so that the radiation profile of the emitted electromagnetic radiation depends on which emission zones are operated. In particular, an LED component may comprise several groups of emission zones, each of which is followed by an optical component. Advantageously, such a component allows a light source with adjustable emission characteristics to be selected by operating different emission zones, especially groups of emission zones. In particular, no optical component is moved mechanically, but the change in the radiation profile is achieved exclusively by controlling different emission zones.

The contact structures may be arranged directly on an outer surface of the control unit. In particular, the contact structures are arranged on the side of the control unit facing away from the emission zones. Advantageously, such an LED component can be surface mounted.

The emission zones may each have an emission surface with the emission surface emitting a large proportion of the electromagnetic radiation generated during operation. Furthermore, the control unit and the emission zones are arranged in a common housing and the electrical contact structures are arranged on the side of the housing facing away from the emission surface. For example, the housing is a quad flat no lead (QFN) package or a micro lead frame. For example, the housing completely surrounds the control unit and the emission zones from all sides. In particular, the housing is transparent to the emitted electromagnetic radiation on the side downstream of the emission zones in the beam path. For example, the housing comprises a transparent area that covers the emission surfaces of the emission zones. Advantageously, such a component is particularly robust. For example, the housing protects the control unit from damaging environmental influences. Furthermore, the arrangement of the control unit and the emission zones in a common housing allows a particularly compact design of the multipixel LED component. In particular, the contact structures form the only electrical contact of the multipixel LED component.

The LED component may have an antenna structure that receives and transmits signals, the antenna structure being monolithically integrated into the housing and connected to the transmission unit. In particular, the antenna structure includes a fractal antenna. For example, the antenna structure electrically connects to the transmission unit and enables transmission and reception of radio signals. Advantageously, an antenna structure allows a particularly long range for wireless transmission of signals so that a multipixel LED component can be located at a large distance from other multipixel LED components and all multipixel LED components receive signals transmitted from a common device. In particular, a plurality of multipixel LED components can be controlled simultaneously using radio signals. In contrast to a series connection via a bus system in the form of a so-called "daisy chain," control via radio signals offers the possibility of avoiding time delays in the control of the individual multipixel LED components.

The emission zones may comprise a common n-contact by which the emission zones can be contacted in an electrically conductive manner. In addition, the emission zones may each include a separate p-contact by which separate p-conducting regions are electrically conductively contacted. The p-conductive region and the n-conductive region, for example, border on an active region in which electromagnetic radiation is generated during normal operation.

In particular, the p-contact and the p-conducting region are electrically isolated from the n-contact and the n-conducting region by an insulator. For example, n-contact is arranged between neighboring p-contacts. In particular, the n-contact can be arranged along a lateral direction between the active regions of adjacent emission zones.

By the current sources, separately pre-settable currents can be impressed into the p-contacts. Furthermore, the current sources can electrically connect to the common n-contact layer. For example, the current sources each have a first contact and a second contact. In particular, the first contacts may be at different electrical potentials and the second contacts may be at the same electrical potential.

I also provide a method of operating a multipixel LED component. In particular, my multipixel LED component described be operated with the method. This means that all features revealed for the multipixel LED component are also revealed for the method and vice versa.

The method is a method of operating a multipixel LED component comprising a plurality of emission zones, a control unit having a plurality of current sources and a transmission unit adapted for wireless data transmission, and two electrical contact structures.

In the method, the transmission unit may receive signals to control the emission zones. The signals are, for example, radio signals that can be received by the transmission unit, for example, by an antenna structure. The signals can be generated, for example, by an electronic device such as a mobile phone or a fixed control unit.

The current sources may be controlled depending on the signals received via the transmission unit. For example, the received signal includes data indicating a setpoint for the current at the output of each current source. In particular, the received signals are converted into control signals by the transmission unit. The current sources can then be controlled by the control signals. Alternatively, the received data can also encode mixed colors or certain lighting scenarios. In this example, the transmission unit converts the received data into corresponding setpoints for the current sources. The setpoints can be taken from a table stored in a memory of the transmission unit.

The current sources may be set up to operate the emission zones separately from each other. In particular, a current source is biuniquely assigned to each emission zone. Accordingly, each current source electrically conductively connects to exactly one emission zone.

The multipixel LED component may be powered exclusively via the two electrical contact structures. For example, all the electrical energy required to operate the multipixel LED component is transmitted via the two contact structures. In particular, apart from the two contact structures, the LED component has no other electrical contact structures for electrical contacting. Furthermore, no signals that control the emission zones are transmitted via the two contact structures.

My method of operating a multipixel LED component is based on the following considerations, among others. Color controllable light sources generally require an electrical contact structure with a plurality of channels, via which the individual emission zones are controlled separately from each other. Therefore, an electrical connection with a multitude of channels is required, whereby a corresponding electrical connection must be provided for each such color controllable light source.

My method makes use, among other things, of the idea that wireless data transmission enables simplified electrical contacting of the multipixel LED component. Thus, the data, that specify how the individual emission zones of a color-controlled light source are to be controlled, are transmitted wirelessly and only the power required to operate the multipixel LED component is provided via the electrical contact. Advantageously, such a process of operating a multipixel LED component enables a particularly compact color-controllable light source that can be electrically contacted and controlled in a particularly simplified manner.

The method relates to operating a multipixel LED component having a plurality of conversion elements, wherein the emitted radiation of individual emission zones is converted into radiation of another wavelength range by the plurality of conversion elements. Thus, by operating different emission zones, the color location of the emitted radiation of the LED component is changed. For example, the conversion elements comprise a first conversion element that converts the electromagnetic radiation generated into radiation in the green wavelength range, and a second conversion element that converts the electromagnetic radiation generated in the emission zone into electromagnetic radiation in the red wavelength range. Advantageously, the color location of the emitted electromagnetic radiation can be selected for such an LED component with such a process of operating the LED component.

The method also relates to operating a multi-pixel LED component with an optical component arranged downstream of some emission zones so that the radiation profile of the emitted radiation of the LED component is changed by operating different emission zones. In particular, optical components may be arranged downstream of individual groups of emission zones. For example, some emission zones are subordinated to a lens so that the emitted electromagnetic radiation is scattered or concentrated in the emission zones to which the lens is subordinated. Alternatively or additionally, an optical component can be subordinated to the emission zones, with which the emitted radiation is deflected. Thus, when operating the emission zones to which the optical component is arranged downstream, the radiation is not emitted perpendicular to the main extension plane of the emission zones. Advantageously, with such a multipixel LED component, different domains can be illuminated with different intensity using a corresponding method of operating the LED component. In particular, the radiation profile can only be changed by controlling different emission zones.

Further advantages and advantageous configurations and further developments of the multipixel LED component result from the following examples shown in connection with the figures.

Same, similar or seemingly similar elements are provided in the figures with the same reference signs. The figures and the proportions of the elements depicted in the figures are not to be regarded as true to scale. Rather, individual elements may be exaggeratedly large for better representability and/or better comprehensibility.

Figure 1A:
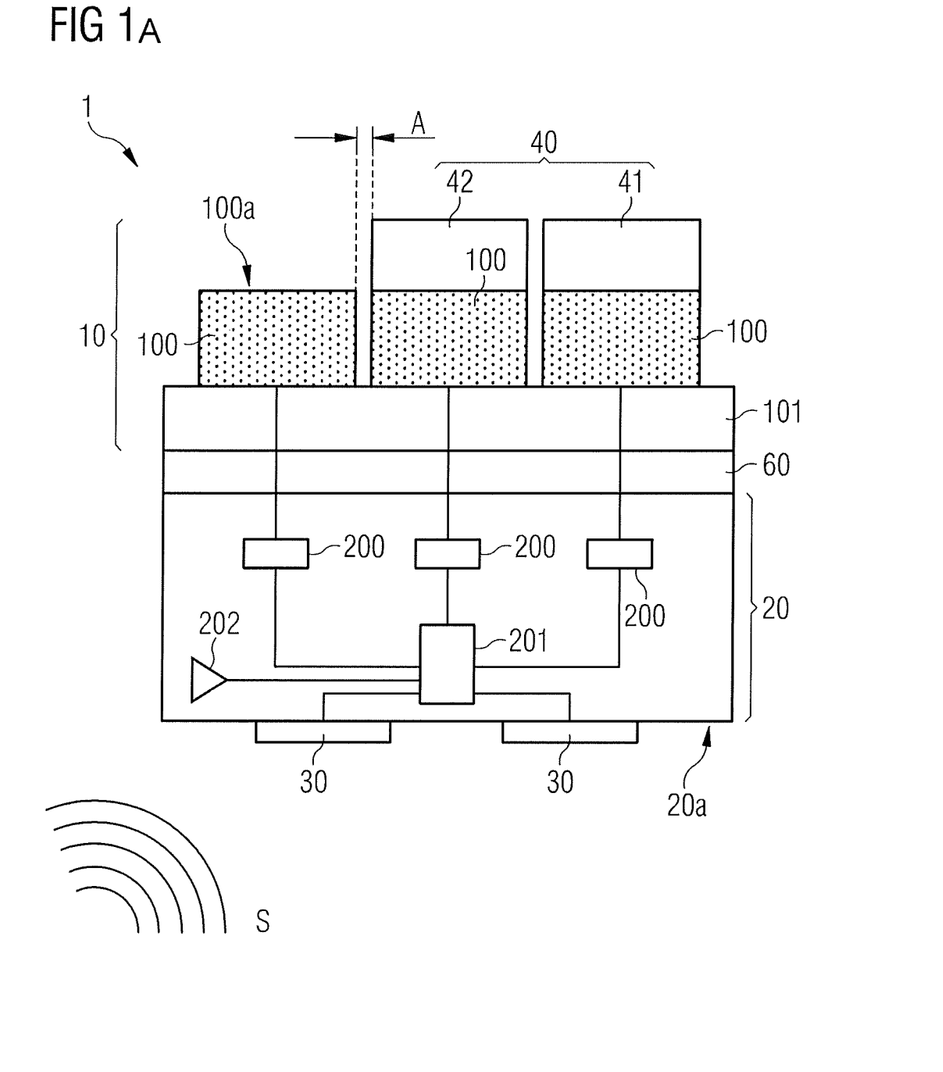
FIG. 1A shows a sectional view of a first example of a multipixel LED component.

FIG. 1A shows a schematic cross-section of a multipixel LED component 1 according to a first example. The multipixel LED component 1 comprises emission zones 100, in particular an LED chip 10, and a control unit 20 mechanically firmly connected to each other by a contact medium layer 60. The contact medium layer 60, for example, can be a structured solder layer that creates a mechanical and electrically conductive connection between the emission zones, in particular the LED chip 10, and the control unit 20. The LED chip 10 comprises three emission zones 100 formed with a semiconductor material, in particular based on gallium nitride. For example, the three emission zones 100 have been produced with the same semiconductor material in a common process on a common substrate. The emission zones 100 generate electromagnetic radiation during normal operation, especially in the blue wavelength range.

Furthermore, the LED chip 10 has a layer 101 that mechanically connects the emission zones 100 to each other. For example, the layer 101 is formed with a semiconductor material. In particular, layer 101 is formed by an epitaxial process. In particular, active regions of the emission zones 100 are not in direct mechanical contact with each other. In other words, the active region of an emission zone 100 is not in direct contact with the active region of an adjacent emission zone 100. For example, the LED chip 10 has a p-type region with a p-doped semiconductor material, an n-type region with an n-doped semiconductor material, and an active region. The active regions is located between the p-conducting and n-conducting regions and generates electromagnetic radiation in the active region during specified normal operation. For example, the p-type region and the active region of the LED chip 10 are completely severed in an oblique direction to the main extension plane of the LED chip 10. The emission zones can mechanically connect to each other via the n-conducting region. The layer 101, for example, is formed with the n-doped semiconductor material of the n-conducting region. In particular, layer 101 is formed exclusively with the n-conducting region.

A distance A in lateral direction, parallel to the main extension direction of the multipixel LED component 1, between two adjacent emission zones 100 is a maximum of 10 µm. In particular, the distance A between two adjacent emission zones 100 is less than 5 µm, preferably less than 2 µm. The lateral expansion of the emission zones can be a maximum of 1 mm, preferably a maximum of 100 µm, particularly preferably a maximum of 50 µm. Advantageously, the distance A between two adjacent emission zones 100 and the lateral extent of the emission zones 100 is so small that an observer only perceives the mixed light of the emitted electromagnetic radiation when operating the emission zones 100, especially adjacent emission zones 100, for example, at a distance of 10 cm. In particular, the electromagnetic radiation emitted in the far field shall not be assigned to the individual emission zones 100.

A first conversion element 41 is arranged on the emission surface 100*a* of an emission zone 100. A second conversion element 42 is arranged on the emission surface 100*a* of a further emission zone 100. In particular, a maximum of one conversion element is assigned to each emission zone 100. The first 41 and second 42 conversion elements are arranged to convert electromagnetic radiation generated in the respective emission zone 100 into electromagnetic radiation of a wavelength range of longer wavelengths. For example, the emission zones 100 without conversion element emit electromagnetic radiation in the blue wavelength range. The first conversion element 41 may be arranged to convert electromagnetic radiation in the blue wavelength range into electromagnetic radiation in the green wavelength range. The second conversion element 42 may be arranged to convert electromagnetic radiation in the blue wavelength range into electromagnetic radiation in the red wavelength range.

The control unit 20 comprises an antenna device 202, a transmission unit 201 and a multiplicity of current sources 200. The control unit 20 is formed, for example, with silicon. In particular, the control unit 20 is a microcontroller chip formed, for example, by typical CMOS technology processes. For example, the current sources 200 and the transmission unit 201 are part of a common silicon-based chip. In other words, the current sources 200 and the transmission unit 201 are monolithically integrated in a common chip. In particular, the antenna structure 202 is monolithically integrated into the control unit 20. Advantageously, this leads to a particularly compact control unit 20.

Emission zones 100 are operated separately from each other by the control unit 20. For example, the emission zones 100 each electrically conductively connect to a current source 200 via the contact medium layer 60. In particular, by the contact medium layer 60 exactly one current source 200 is biuniquely assigned to each emission zone 100. The current source 200 is intended to energize the emission zone 100 assigned to the current source 200 as intended. For example, the brightness of the electromagnetic radiation emitted by the emission zones can be adjusted by a current intensity and/or a pulse-width modulated signal. The current sources 200 are controlled by the transmission unit 201. For example, a control signal runs from transmission unit 201 to each current source. This control signal determines how high the current at the output of a current source is 200 and is applied to the respective emission zone 100.

The antenna apparatus 202 is arranged to transmit and/or receive signals S. Signals S include data. The data specify how the individual emission zones 100 are controlled by the current sources 200. The signal S can be a radio signal, in particular a WLAN or Bluetooth signal. For example, the current with which the individual emission zones 100 are energized is specified exclusively via the signals S. The current is then fed to the individual emission zones 100.

Furthermore, the multipixel LED component 1 comprises two contact structures 30, via which the multipixel LED component 1 is energized. In particular, the multipixel LED component 1 has exactly two electrical contact structures 30 for electrical contacting and are arranged directly on an outer surface 20a of the control unit 20. For example, the contact structures 30 are arranged on the side of the multipixel LED component 1 facing away from the emission surface 100a. The contact structures 30 are used exclusively to power the multipixel LED component 1. In particular, the contact structures 30 do not transmit any signals to control the multipixel LED component 1.

When the multipixel LED component 1 is used as intended, 202 signals S that control the emission zones 100 are received via the antenna structure. For example, the signals S contain data containing setpoints for the current supply to the emission zones 100. The current sources 200 are controlled by the transmission unit 201 depending on the signals S received. In particular, each current source 200 is controlled separately so that the emission zones 100 are operated separately from each other. The signals S that control the emission zones 100 are received exclusively via the antenna structure 202 and the electrical power that operates the emission zones 100 and the control unit 20 is transmitted exclusively via the contact structures 30. Advantageously, the intensity as well as the color coordinates of the radiation emitted by the multipixel LED component 1 can be changed by a different control of the emission zones 100.

Advantageously, the emission zones 100 and the control unit 20 have a particularly compact arrangement. For example, the control unit 20 and the emission zones 100 are arranged at least partially overlapping in a vertical direction perpendicular to the main extension plane of LED component 1. For example, the emission zones 100, in particular the LED chip 10, and the control unit 20 are flush with each other in the lateral direction. The emission zones 100 and the control unit 20 mechanically connect directly to each other, for example, by a contact medium layer 60. For example, the connection between emission zones 100 and control unit 20 is not non-destructively detachable. In particular, the connection between the control unit 20 and the emission zones can only be broken by destroying one of the components. For example, the emission zones 100 and the control unit 20 are not arranged separately from each other on a common carrier that serves as a mechanical load-bearing component.

Figure 1B:
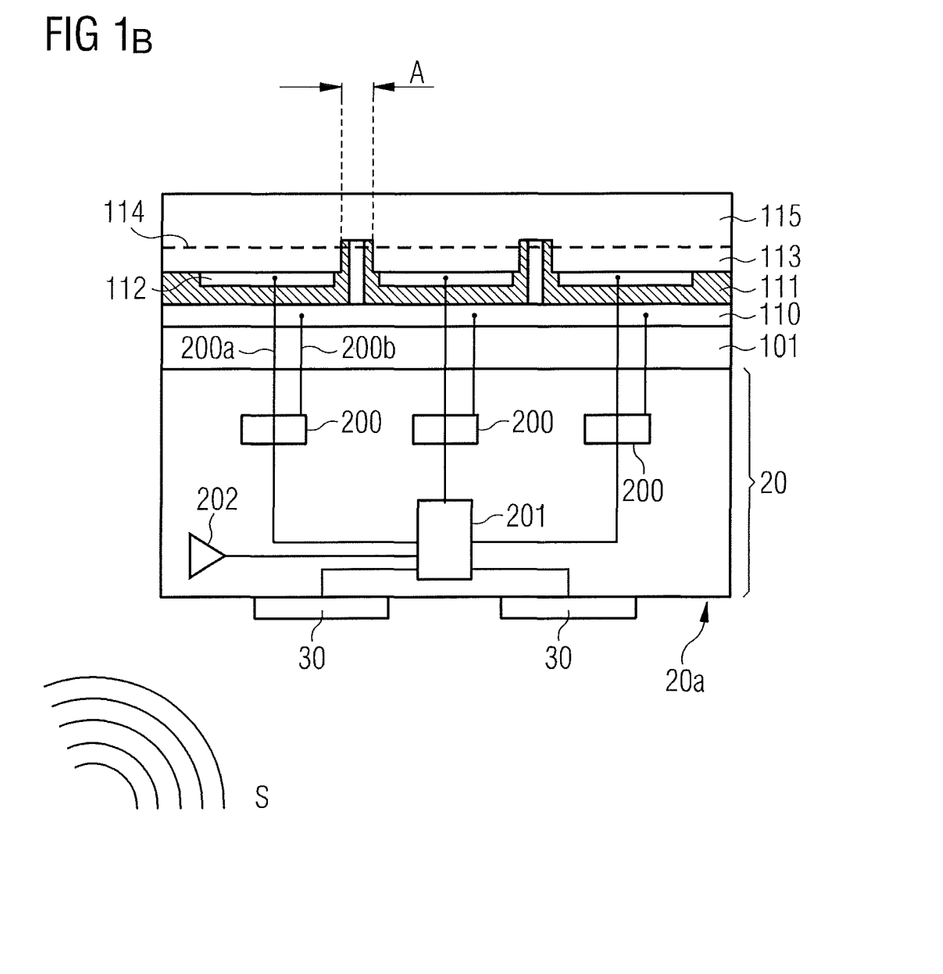
FIG. 1B shows a cross-sectional view of another example of a multipixel LED component.

FIG. 1B shows a schematic cross-section of a multipixel LED component 1 according to another example. Analogous to the first example shown in FIG. 1A, the control unit 20 comprises current sources 200, a transmission unit 201 and an antenna structure 202. The emission zones 100 are formed with a common n-contact 110 by which a common n-conducting region 115 of the emission zones 100 is electrically conductively contacted. Furthermore, the emission zones 100 each comprise a separate p-contact 112 by which separate p-conducting regions 113 are electrically conductively contacted. The p-conductive region 113 and the n-conductive region 115 are adjacent to an active region 114 that generates electromagnetic radiation during normal operation. The p-contact 112 and the p-conducting region 113 are electrically isolated from the n-contact 110 and the n-conducting region 115 by an insulator 111. By the current sources 200, separately pre-settable currents can be impressed into the p-contacts 112. Furthermore, the current sources 200 electrically connect to the common n-contact layer 110. The current sources 200, for example, each have a first contact 200a and a second contact 200b. The first contacts 200a can be on different electrical potentials and the second contacts 200b can be on the same electrical potential.

Figure 2:
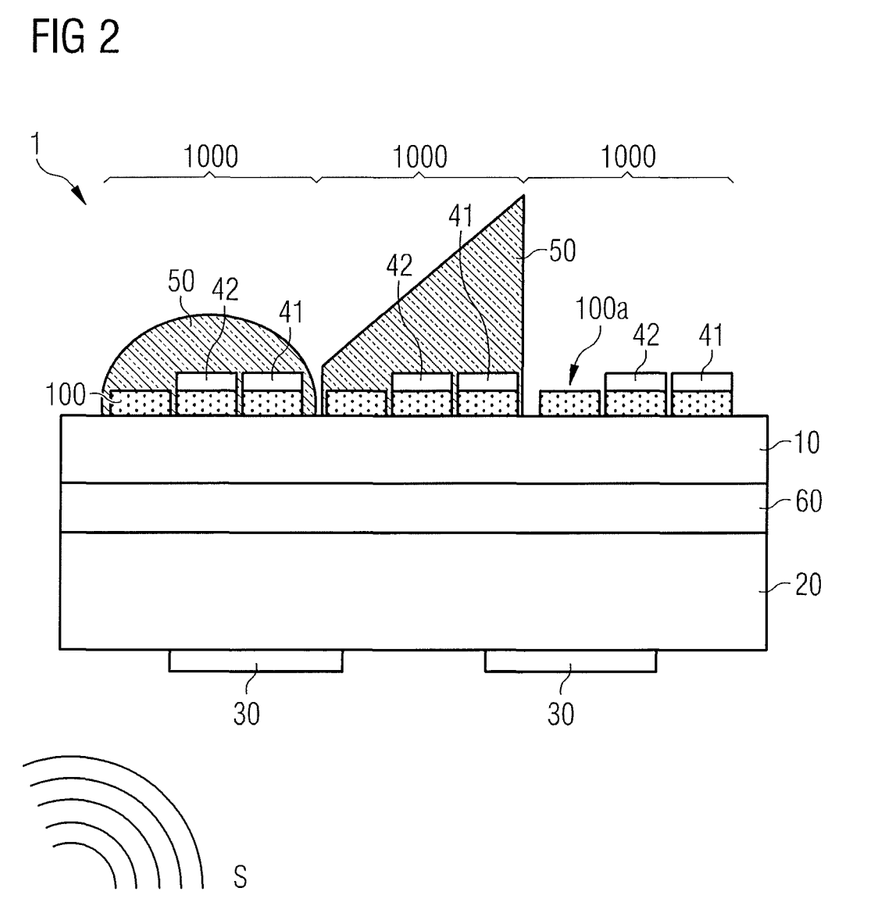
FIG. 2 shows a sectional view of a second example of a multipixel LED component with optical components.

FIG. 2 shows a schematic cross-section of a multipixel LED component 1 according to a second example. Analogous to the first example shown in FIG. 1A, the control unit 20 comprises current sources 200, a transmission unit 201 and an antenna structure 202. For reasons of clarity, these structures are not shown in the second example. In contrast to the first example shown in FIG. 1A, the LED chip 10 comprises several groups 1000 of emission zones 100, whereby in this example one group 1000 of emission zones 100 comprises three emission zones 100. Alternatively, a group 1000 emission zones 100 may include more or less emission zones 100. In particular, a group 1000 of emission zones 100 can form a pixel of the multipixel LED component 1.

Some emission zones 100 of a group 1000 are followed by a first 41 or second 42 conversion element. For example, each group 1000 of emission zones 100 emits electromagnetic radiation in the red, green and blue wavelength ranges. An optical component 50 is subordinate to each group 1000. For example, the optical component 50 can have a concave curved or convex curved surface and be formed with a transparent material. Alternatively, the optical component 50 may have a surface transverse to the emission surface 100a of the emission zones 100. In particular, the optical component may comprise scattering or reflecting materials. The optical components 50 are arranged downstream to the emission zones 200 in the beam path, whereby the optical components change the radiation profile of the radiation emitted by the emission zones 100, to which the optical component is arranged downstream. For example, the optical component 50 can bundle, scatter, expand and/or deflect the electromagnetic radiation emitted by the emission zones 100, to which the optical component 50 is arranged downstream. In particular, different groups 1000 of emission zones 100 have a different radiation profile. Advantageously, the radiation profile of the emitted radiation of the multipixel LED component 1 can be changed by operating different groups 1000 of emission zones 100. In particular, the beam profile of the multipixel LED component 1 is changed without any mechanical movement of an optical component 50. In particular, the radiation profile of the emitted radiation of LED component 1 can be changed by only selectively controlling certain emission zones 100.

Figure 3:
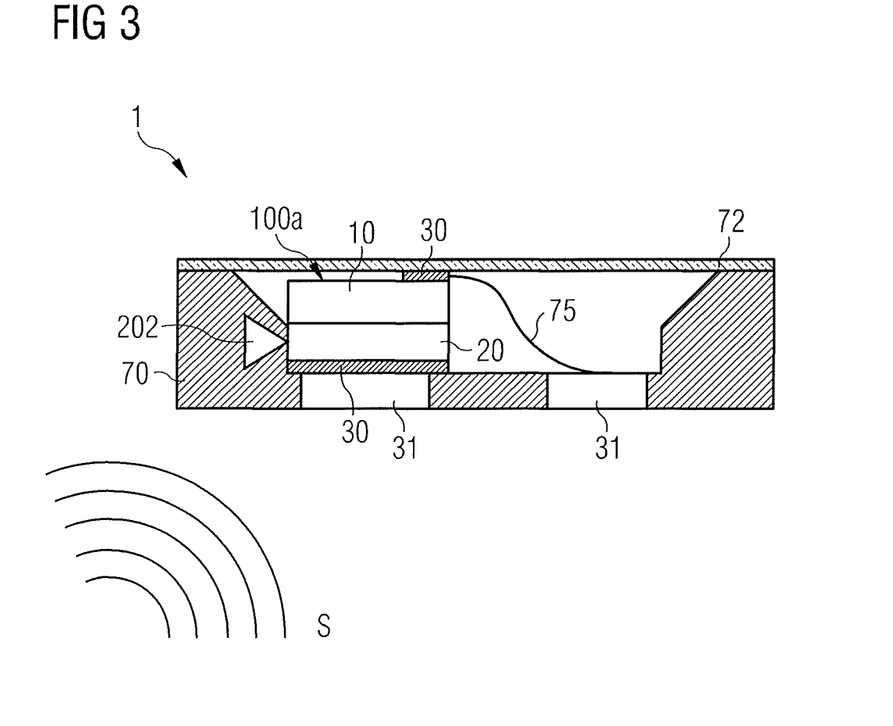
FIG. 3 shows a sectional view of a third example of a multipixel LED component with a housing.

FIG. 3 shows a schematic cross-section of a multipixel LED component 1 according to a third example. The multipixel LED component 1 comprises an LED chip and a control unit 20 mechanically fixed to each other. For example, the LED chip 10 and the control unit 20 are directly bonded to each other without a connecting means. In particular, the LED chip 10 and the control unit 20 are arranged overlapping and flush with each other in a vertical direction perpendicular to the main extension plane of the multipixel LED component 1.

The control unit 20 and the emission zones 100, in particular the LED chip 10, are arranged in a housing 70. For example, the housing 70 completely surrounds the emission zones 100 and the control unit 20 from all sides. In this example, the antenna structure 202 is not monolithically integrated into the control unit 20, but is integrated into the housing 70 outside the control unit 20. The package also includes contact pads 31 to which the contact structures 30 electrically connect. The multipixel LED component can be electrically contacted via the contact pads 31. For example, the housing 70 is a Quad Flat No Leads (QFN) package or a micro-lead frame.

The housing 70 has a transparent area 72 on the side facing the emission surface 100a. In particular, the transparent area 72 is transparent to the electromagnetic radiation generated in emission zones 100. The contact pads 31 are integrated into the housing 70 on the side of the housing 70 facing away from the transparent area 72. One of the contact structures 30 is connected to a contact pad 31 via a connecting wire 75. A further contact structure 30 is in direct contact with the contact pad 31 assigned to the contact structure 30. For reasons of clarity, the individual emission zones 100, the conversion elements 40 and the common semiconductor layer 101 of the LED chip 10 and the current sources 200 and the transmission unit 201 of the control unit 20 are not explicitly shown in the third example.

My components and methods are not limited by the description using the example. Rather, this disclosure includes any new feature and any combination of features that in particular includes any combination of features in the appended claims, even if the feature or combination itself is not explicitly mentioned in the claims or examples.

This application claims priority of DE 102016122237.2, the subject matter of which is incorporated herein by reference.

The invention claimed is:

1. A multipixel LED component comprising:
a plurality of emission zones;
a plurality of conversion elements adapted to convert radiation emitted from the emission zones into radiation of another wavelength range;
a controller comprising a plurality of current sources and a transmitter adapted for wireless data transmission; and
two electrical contact structures through which the multipixel LED component is energized, wherein
the controller mechanically fixedly connects to the emission zones,
each of the current sources is assigned to one of the emission zones biuniquely,
the transmitter receives signals to control the current sources,
the current sources are controllable according to the signals,
each current source operates the emission zone assigned to it,
the number of emission zones is greater than the number of electrical contact structures,
the emission zones are part of a common LED chip, and
all emission zones comprise a common, continuous emission surface.

2. The multipixel LED component according to claim 1, wherein the emission zones and the controller are arranged at least partially overlapping one another in a vertical direction.

3. The multipixel LED component according to claim 1, wherein a distance in a lateral direction between two adjacent emission zones is a maximum of 200 μm.

4. The multipixel LED component according to claim 1, wherein the controller is formed with silicon.

5. The multipixel LED component according to claim 1, wherein the emission zones emit light in the blue wavelength range and the conversion elements comprise first and second conversion elements, by the first conversion elements the emitted light of some emission zones is converted to light in the green wavelength range, and by the second conversion elements the emitted light of some emission zones is converted to light in the red wavelength range.

6. The multipixel LED component according to claim 1, wherein at least one optical component is arranged downstream of some emission zones in the beam path, and the at least one optical component changes the emission profile of the radiation emitted by the emission zones to which the optical component is arranged downstream.

7. The multipixel LED component according to claim 1, wherein
the emission zones each have an emission surface, the emission surface emitting a large part of the electromagnetic radiation generated in operation in the emission zone,
the controller and the emission zones are arranged in a common housing, and
the electrical contact structures are arranged on a side of the housing facing away from the emission surfaces.

8. The multipixel LED component according to claim 7, further comprising an antenna structure that receives and transmits signals, wherein the antenna structure is monolithically integrated into the housing and connected to the transmitter.

9. The multipixel LED component according to claim 1, wherein the plurality of emission zones comprise a common n-contact by which the emission zones electrically conductively contactable.

* * * * *